United States Patent
Balakrishnan et al.

(10) Patent No.: US 10,553,708 B2
(45) Date of Patent: Feb. 4, 2020

(54) TWIN GATE TUNNEL FIELD-EFFECT TRANSISTOR (FET)

(71) Applicant: International Business Machines Corporation, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 45 days.

(21) Appl. No.: 15/689,522

(22) Filed: Aug. 29, 2017

(65) Prior Publication Data

US 2019/0067459 A1 Feb. 28, 2019

(51) Int. Cl.
*H01L 29/66* (2006.01)
*H01L 29/423* (2006.01)
*H01L 29/786* (2006.01)
*H01L 27/108* (2006.01)

(52) U.S. Cl.
CPC .. *H01L 29/66977* (2013.01); *H01L 27/10802* (2013.01); *H01L 29/42392* (2013.01); *H01L 29/66545* (2013.01); *H01L 29/66742* (2013.01); *H01L 29/78642* (2013.01); *H01L 29/78645* (2013.01)

(58) Field of Classification Search
CPC ......... H01L 29/66977; H01L 29/42392; H01L 29/66545; H01L 29/66742; H01L 29/78642; H01L 29/78645; H01L 27/108022

USPC .......................................................... 257/105
See application file for complete search history.

(56) References Cited

U.S. PATENT DOCUMENTS

| | | | | |
|---|---|---|---|---|
| 9,029,934 B2* | 5/2015 | Kito | ................. | H01L 27/11551 257/320 |
| 10,276,714 B2* | 4/2019 | Balakrishnan | ...... | H01L 29/7827 |
| 2008/0179659 A1* | 7/2008 | Enda | ..................... | H01L 27/115 257/326 |
| 2011/0032772 A1* | 2/2011 | Aritome | ............ | H01L 27/11551 365/185.29 |
| 2011/0241105 A1* | 10/2011 | Renn | ................. | H01L 27/10802 257/330 |

(Continued)

OTHER PUBLICATIONS

N. Navlakha et al., "Improved Retention Time in Twin Gate IT DRAM with Tunneling Based Read Mechanism," IEEE Electron Device Letters, Sep. 2016, pp. 1127-1130, vol. 37, No. 9.

*Primary Examiner* — Ori Nadav
(74) *Attorney, Agent, or Firm* — L. Jeffrey Kelly; Ryan, Mason & Lewis, LLP (57) ABSTRACT

A method of manufacturing a vertical transistor device comprises forming a bottom source region on a semiconductor substrate, forming a channel region extending vertically from the bottom source region, forming a top drain region on an upper portion of the channel region, forming a first gate region having a first gate length around the channel region, and forming a second gate region over the first gate region and around the channel region, wherein the second gate region has a second gate length different from the first gate length, and wherein at least one dielectric layer is positioned between the first and second gate regions.

18 Claims, 4 Drawing Sheets

(56) References Cited

U.S. PATENT DOCUMENTS

| | | | |
|---|---|---|---|
| 2012/0181603 A1* | 7/2012 | Ahn | H01L 27/11551 257/329 |
| 2015/0243707 A1* | 8/2015 | Park | H01L 27/2454 257/2 |
| 2016/0111517 A1* | 4/2016 | Wu | H01L 45/08 438/154 |
| 2017/0154895 A1* | 6/2017 | Huo | H01L 21/28282 |
| 2017/0365712 A1* | 12/2017 | Bu | H01L 29/7827 |
| 2018/0090598 A1* | 3/2018 | Xie | H01L 29/66666 |

* cited by examiner

TWIN GATE TUNNEL FIELD-EFFECT TRANSISTOR (FET)

BACKGROUND

The Internet of Things (IoT) includes a network of a variety of elements (also referred to as "connected devices" and "smart devices") including, for example, physical devices, vehicles, buildings, and other electronic and software items capable of network connectivity. The connected objects collect and exchange data. The devices connected in the IoT are typically low power devices. A criterial or motivational point for low power devices is for batteries on independent small devices to last for extended time periods (e.g., years). Tunnel field-effect transistors (FETs) are devices suited for low power applications because the tunnel FETs exhibit low off current, steep subthreshold swing and weak temperature dependence.

In addition to logic tunnel FETs, dynamic random access memory (DRAM) is also useful in IoT devices. Despite the low on current of tunnel FETs, the relatively high $I_{on}/I_{off}$ ratio of tunnel FETs makes them suitable for low power dynamic memory applications. Additionally, the use of vertical transistor structures are area efficient and allow dense integration.

SUMMARY

Illustrative embodiments of the invention provide a structure for and methods of forming a vertical twin gate tunnel FET DRAM.

According to an exemplary embodiment of the present invention, a method of manufacturing a vertical transistor device comprises forming a bottom source region on a semiconductor substrate, forming a channel region extending vertically from the bottom source region, forming a top drain region on an upper portion of the channel region, forming a first gate region having a first gate length around the channel region, and forming a second gate region over the first gate region and around the channel region, wherein the second gate region has a second gate length different from the first gate length, and wherein at least one dielectric layer is positioned between the first and second gate regions.

According to an exemplary embodiment of the present invention, a semiconductor device comprises a substrate, a bottom source region on the substrate, a channel region extending vertically from the bottom source region, a top drain region on an upper portion of the channel region, a first gate region having a first gate length and formed around the channel region, a second gate region formed over the first gate region and around the channel region, and at least one dielectric layer positioned between the first and second gate regions, wherein the second gate region has a second gate length different from the first gate length.

According to an exemplary embodiment of the present invention, a method for manufacturing a vertical tunnel field-effect transistor (FET) comprises forming a bottom source region on a semiconductor substrate, forming a channel region extending vertically from the bottom source region, forming a top drain region on an upper portion of the channel region, forming a first gate region having a first gate length on the bottom source region, forming at least one dielectric layer on the first gate region, and forming a second gate region on the at least one dielectric layer, wherein the second gate region has a second gate length different from the first gate length, and wherein the bottom source region is doped with a different dopant type than the top drain region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

In illustrative embodiments, techniques are provided for fabricating tunnel FET DRAMs. More particularly, illustrative embodiments provide techniques for fabricating vertical twin gate tunnel FET DRAMs. As will be explained in illustrative embodiments, such fabrication techniques are advantageous over conventional fabrication techniques.

Vertical FET (VFET) devices include channels (e.g., fin channels) with source/drain regions at ends of the channels on top and bottom sides of the channel regions. Current runs through the channels in a vertical direction (e.g., perpendicular to a substrate), for example, from a bottom source/drain region to a top source/drain region.

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount.

In the figures, the illustrated scale of one layer, structure, and/or region relative to another layer, structure, and/or region is not necessarily intended to represent actual scale. One or more layers and/or regions of a type commonly used in, for example, a tunnel FET, a complementary metal-oxide semiconductor (CMOS), nanowire FET, fin field-effect transistor (FinFET), metal-oxide-semiconductor field-effect transistor (MOSFET), vertical FET (VFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, tunnel FETs, VFETs, nanowire FETs, CMOSs, MOSFETs and/or FinFETs. By way of non-limiting example, the semiconductor devices can include, but are not limited to tunnel FET, VFET, nanowire FET, CMOS, MOSFET and FinFET devices, and/or semiconductor devices that use tunnel FET, CMOS, MOSFET, VFET, nanowire FET, and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention provide novel tunnel FET device designs and methods of manufacturing same. For example, in accordance with an embodiment of the present invention, a twin gate tunnel FET DRAM is formed as a vertical transistor structure in a vertical stacked integration scheme.

According to an embodiment of the present invention, the two gates of a twin gate tunnel FET DRAM have different gate lengths and have different functionality in the operation of the DRAM. A first gate having a larger gate length than a second gate governs the read mechanism based on band-to-band tunneling whereas the second gate having a shorter gate length is responsible to create and preserve a physical well for charge storage. A negative bias at the second gate during a write (e.g., write "1") increases the hole concentration in the potential well due to band-to-band tunneling between the drain and the second gate. A positive bias at the second gate, applied during a write (e.g., write "0") removes holes from the well which recombine at the drain.

The read operation is also based on band-to-band tunneling, controlled by the first gate through a bias that permits the electrons to tunnel from a p+ source to the channel. The electrons are drifted towards the drain by applying voltage at the second gate and the drain, respectively. Due to the presence of extra charges, effective potential at the front interface of the intrinsic region is more positive for state "1" than that for state "0". This results in a lower barrier for electrons, which leads to a higher drain current for read "1" as compared to read "0". During the hold operation, a small negative bias is applied at the second gate that retains holes in the physical well after write "1", whereas after write "0" the potential well is depleted of holes.

The advantages of a twin gate tunnel FET, as described above, are further enhanced by embodiments of the current invention, which include methods of forming a vertical twin gate tunnel FET DRAM. The vertical twin gate tunnel FET DRAM comprises a long vertical channel encapsulated by two independent gates with different gate lengths oriented vertically with respect to each other. Referring generally to FIG. 7, the gates are separated by a dielectric, and the device includes a source and drain that are oppositely doped from each other. As can be understood from FIGS. 5 and 6 described in more detail herein, the two independent gates wrap around a vertical channel.

Figure 1:
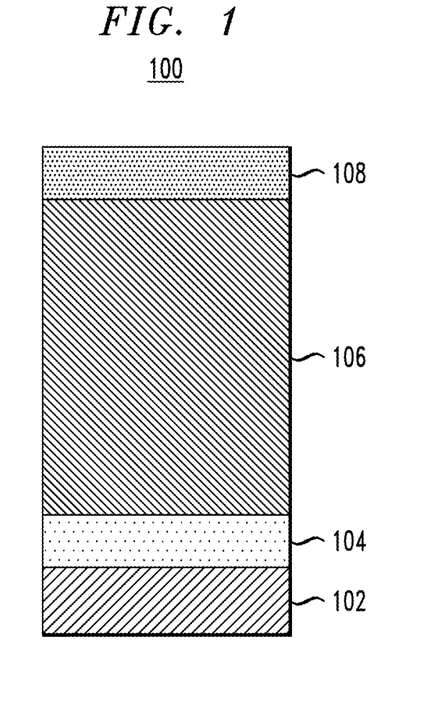
FIG. 1 is a schematic cross-sectional view illustrating manufacturing of a vertical tunnel FET and showing formation of a channel region between first and second doped regions, according to an embodiment of the invention.

FIG. 1 is a schematic cross-sectional view illustrating manufacturing of a vertical tunnel FET and showing formation of a channel region between first and second doped regions, according to an embodiment of the invention. Referring to FIG. 1, the device 100 includes a semiconductor substrate 102. In one embodiment, a semiconductor substrate 102 includes semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 102 can be a bulk substrate or a silicon-on-insulator (SOI) substrate including a buried insulating layer, such as, for example, a buried oxide or nitride layer.

Multiple layers 104, 106 and 108 are epitaxially grown on the semiconductor substrate by an integrated epitaxy process. A first doped layer 104 (e.g., p+ doped layer) is formed on the substrate 102. According to an embodiment, the layer 104 is a p-type doped layer comprising epitaxially grown silicon (Si), silicon germanium (SiGe) or other semiconductor material, which is doped by, for example, ion implantation, in situ, gas phase doping, plasma doping, plasma immersion ion implantation, cluster doping, infusion doping, liquid phase doping, solid phase doping, etc., and dopants may include, for example, boron (B), gallium (Ga), indium (In) or thallium (Tl) at various concentrations. For example, in a non-limiting example, a dopant concentration range may be e20/cm$^3$ to e21/cm$^3$, with 4e20/cm$^3$ to 1e21/cm$^3$ preferred, to form a source region.

An undoped layer 106 including, for example, silicon (Si), silicon germanium (SiGe) or other semiconductor material, is then epitaxially grown on the first doped layer 104. A portion of the undoped layer 106 will form a channel region. A second doped layer 108 (e.g., n+ doped layer) is formed on the undoped layer 106. According to an embodiment, the layer 108 is an n-type doped layer comprising epitaxially grown silicon (Si), silicon germanium (SiGe) or other semiconductor material, which is doped by, for example, ion implantation, in situ, gas phase doping, plasma doping, plasma immersion ion implantation, cluster doping, infusion doping, liquid phase doping, solid phase doping, etc., and dopants may include, for example, phosphorus (P), arsenic (As) or antimony (Sb) at various concentrations. For example, in a non-limiting example, a dopant concentration range may be e20/cm$^3$ to e21/cm$^3$, with 4e20/cm$^3$ to 1e21/cm$^3$ preferred, to form a drain region. According to an embodiment, in a resulting vertical tunnel FET as described in connection with FIG. 6, layer 104 is formed into a p-doped source region, layer 106 is formed into a channel of a PFET, and layer 108 is formed into an n-doped drain region. Alternatively, layer 104 can be formed into an n-doped source region, and layer 108 can be formed into a p-doped drain region.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

By "in-situ" it is meant that the dopant that dictates the conductivity type of doped layer is introduced during the process step, e.g., epitaxial deposition, that forms the doped layer.

Figure 2:
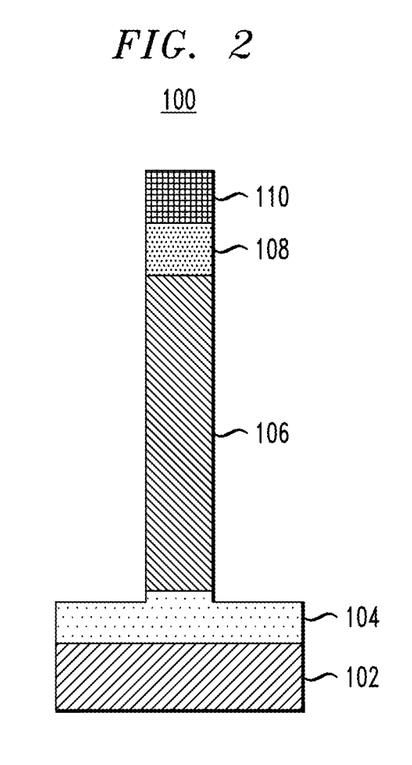
FIG. 2 is a schematic cross-sectional view illustrating manufacturing of a vertical tunnel FET and showing patterning to form a pillar, according to an embodiment of the invention.

FIG. 2 is a schematic cross-sectional view illustrating manufacturing of a vertical tunnel FET and showing patterning to form a pillar including parts of layers 104, 106 and 108, according to an embodiment of the invention. Referring to FIG. 2, a hardmask 110 including, for example silicon nitride (SiN) or other material, such as, but not necessarily limited to, SiBCN or SiOCN, is deposited on the second doped layer 108. Exposed portions of the layers 104, 106 and 108 not protected by the hardmask 110 are removed down through part of the first doped layer 104 using an etch process, such as, for example, an anisotropic etch process, including, but not limited to, a reactive ion etch (RIE) process. As can be seen, the resulting structure includes parts of layers 104, 106 and 108 under the hardmask 110.

Figure 3:
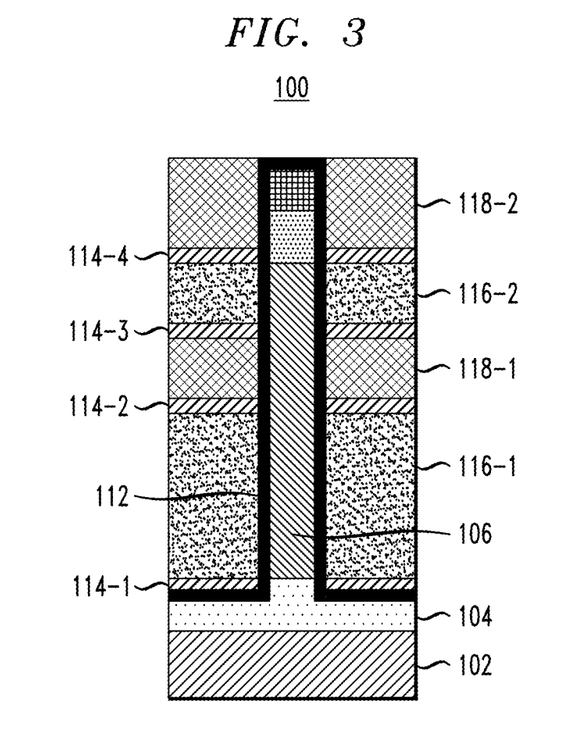
FIG. 3 is a schematic cross-sectional view illustrating manufacturing of a vertical tunnel FET and showing formation of a liner and multiple layers around a fin, according to an embodiment of the invention.

FIG. 3 is a schematic cross-sectional view illustrating manufacturing of a vertical tunnel FET and showing formation of a liner and multiple layers around a fin, according to an embodiment of the invention. Referring to FIG. 3, a thin liner layer 112, for example in the range of about 2 nm-about 6 nm, is formed on each side of the pillar, and on exposed surfaces adjacent the pillar on layer 104. The liner 112 comprises, for example, silicon oxide, and is deposited by, for example, conformal deposition, such as, for example, atomic layer deposition (ALD). Liner 112 is also formed over the top surface and vertical sides of hardmask 110, the vertical sides of layers 108 and 106, and the top surface and vertical sides of layer 104.

Following the formation of the liner 112, directional deposition of multiple layers is performed. As illustrated in FIG. 3, multiple layers of spacers, gap material, and dummy gates are deposited in contact with liner 112. For example, spacer layers 114-1, 114-2, 114-3 and 114-4 comprise SiN or other material, such as, for example, SiBCN and/or SiOCN, the gap layers 118-1 and 118-2 comprise, for example, silicon oxide, and dummy gate layers 116-1 and 116-2 comprise, for example, amorphous silicon, of different thicknesses from each other. As described further herein in connection with FIG. 5, the different thicknesses of the dummy gate layers 116-1 and 116-2 enable the formation of gates with different gate lengths for a twin gate tunnel FET DRAM. Following the deposition of the multiple layers, the upper most surface may be planarized using, for example, chemical mechanical planarization (CMP) or other planarization process. In an alternative embodiment, the dielectric stack of spacer layers 114-2 and 114-3 and gap layer 118-1 between the spacer layers 114-2 and 114-3 may be substituted with a single nitride layer.

Directional deposition techniques for forming the layers 114, 116 and 118 include, but are not necessarily limited to, high density plasma (HDP) deposition and gas cluster ion beam (GCIB) deposition. The spacer layers 114-1 to 114-4 are spacers for the resulting vertical tunnel FET and may have a thickness range of about 2 nm-about 10 nm, with about 4 nm-about 6 nm preferred. A thickness range for a first dummy gate layer 116-1 is about 20 nm-about 50 nm and a thickness range for a second dummy gate layer 116-2 is about 10 nm-about 30 nm to result in different gate lengths for the gates of the vertical tunnel FET. A thickness range for a first gap layer 118-1 is about 20 nm-about 50 nm and a thickness range for a second gap layer 118-2 is about 10 nm-about 40 nm.

Figure 4:
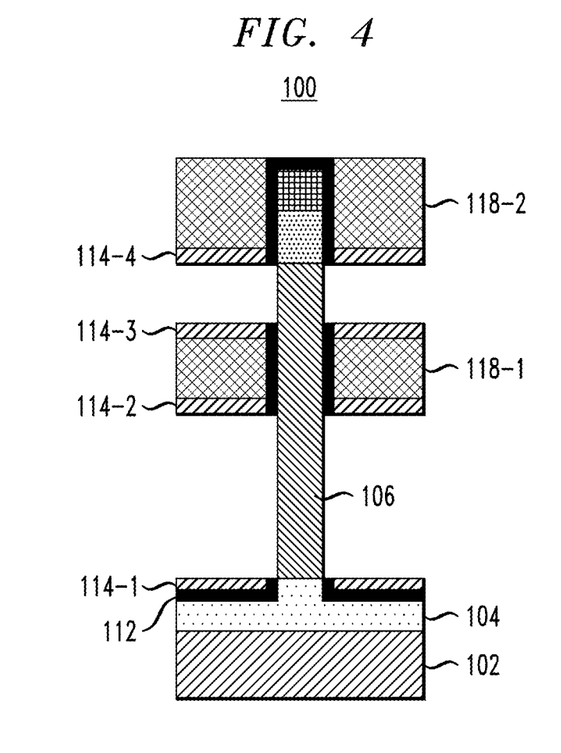
FIG. 4 is a schematic cross-sectional view illustrating manufacturing of a vertical tunnel FET and showing removal of dummy gate regions and portions of a liner layer, according to an embodiment of the invention.

FIG. 4 is a schematic cross-sectional view illustrating manufacturing of a vertical tunnel FET and showing removal of dummy gate regions 116-1 and 116-2 and portions of liner layer 112, according to an embodiment of the invention. Referring to FIG. 4, the dummy gates 116-1 and 116-2 are removed by an appropriate removal process, such as, for example, selective anisotropic etching of the dummy gate material (e.g., amorphous Si (a-Si)), followed by selective anisotropic etching of the exposed portions of the liner 112. As can be understood, the etching is selective with respect to the material (e.g., nitride) of the spacer layers 114-1 to 114-4.

Figure 5:
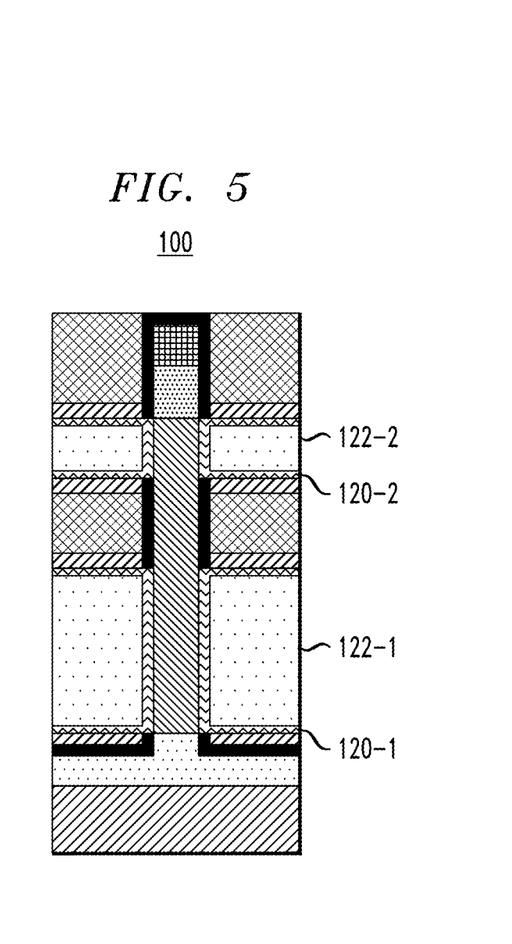
FIG. 5 is a schematic cross-sectional view illustrating manufacturing of a vertical tunnel FET and showing formation of dielectric and gate layers, according to an embodiment of the invention.

FIG. 5 is a schematic cross-sectional view illustrating manufacturing of a vertical tunnel FET and showing formation of dielectric and gate layers, according to an embodiment of the invention. Referring to FIG. 5, a dielectric 120-1 and 120-2 is conformally deposited on the spacer layers 114-1 to 114-4 in the spaces left after removal of the dummy gates 116-1 and 116-2, followed by deposition of gate metal layers 122-1 and 122-2 on the dielectrics 120-1 and 120-2 in the remaining portions of the spaces left after removal of the dummy gates 116-1 and 116-2. The dielectric and gate metal layers can be deposited using deposition techniques, including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The dielectric layers 120-1 and 120-2 can include, but are not necessarily limited to, high-K dielectrics such as $HfO_2$ (hafnium oxide), $ZrO_2$ (zirconium dioxide), hafnium zirconium oxide, $Al_2O_3$ (aluminum oxide), and/or $Ta_2O_5$ (tantalum pentoxide). The gate metal layers can include, but are not necessarily limited to, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. As can be seen in FIG. 5 by the thickness of the gate regions 122-1 and 122-2 measured perpendicular to the substrate 102, the gate length of gate 122-1 is greater than the gate length of gate 122-2.

Figure 6:
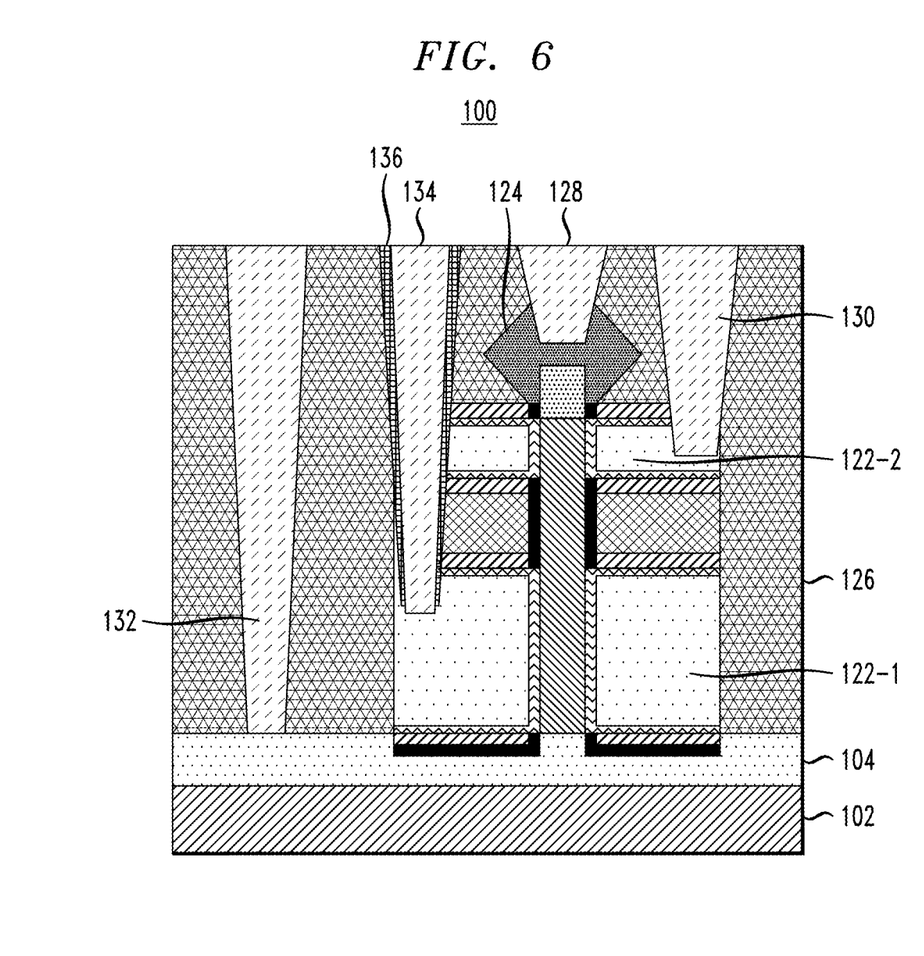
FIG. 6 is a schematic cross-sectional view illustrating manufacturing of a vertical tunnel FET and showing formation of an inter-level dielectric (ILD) layer and contacts, according to an embodiment of the invention.
Figure 7:
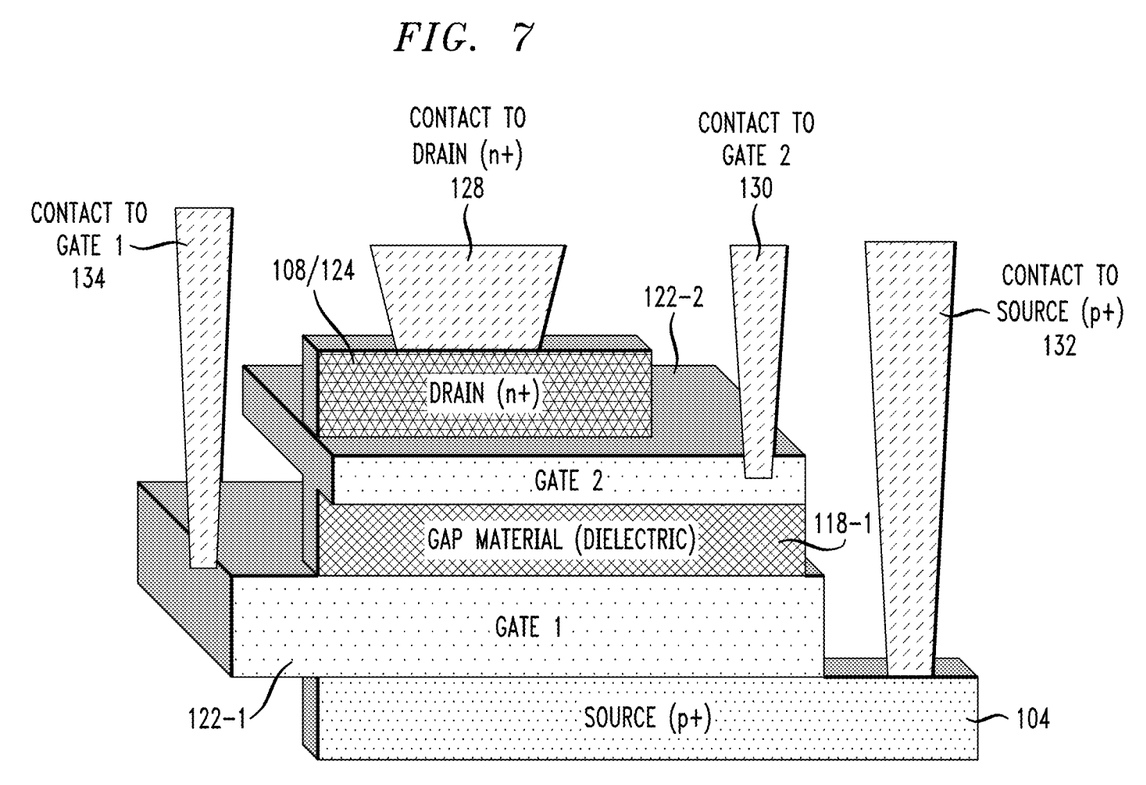
FIG. 7 is a schematic three-dimensional view illustrating a structure of a vertical tunnel FET and contacts, according to an embodiment of the invention.

FIG. 6 is a schematic cross-sectional view illustrating manufacturing of a vertical tunnel FET and showing formation of an inter-level dielectric (ILD) layer and contacts, according to an embodiment of the invention. Referring to FIG. 6, the hardmask 110 and gap layer 118-2, as well as a portion of the liner 112 on which the gap layer 118-2 is formed are removed using, for example, selective etch processes in which the hardmask 110, the gap layer 118-2 and the portion of the liner 112 are selectively removed with respect to the remaining layers.

A top epitaxial portion 124 is grown from the layer 108 to form, for example, n+ drain region, which includes the layer 108 and epitaxial portion 124. The epitaxial portion 124 has the same doping type as the layer 108, and can be formed using the same semiconductor material as or a different semiconductor material from the layer 108. The epitaxial growth is followed by deposition of an inter-level dielectric (ILD) 126, as illustrated in FIG. 6. The ILD layer 126 can be deposited using deposition techniques including, but not limited to, CVD, PECVD, RFCVD, PVD, ALD, MLD, MBD, PLD, LSMCD, and/or sputtering, followed by planarization by, for example, CMP. The ILD layer 126 can include, but is not necessarily limited to, silicon dioxide ($SiO_2$), low-temperature oxide (LTO), high-temperature oxide (HTO), field oxide (FOX) or some other dielectric.

Source contact 132 contacting source region 104, drain contact 128 contacting drain region 124/108, first gate contact 134 contacting gate 122-1 and second gate contact 130 contacting gate 122-2 are formed in openings (e.g., contact vias) formed in the ILD layer 126. The contacts 128, 130, 132 and 134 can include contact material, such as, for example, electrically conductive material including, but not necessarily limited to, tungsten, cobalt, zirconium, tantalum, titanium, aluminum, ruthenium, and/or copper, which fills the contact vias. An insulating liner 136 can line the via for first gate contact 134 in order to isolate the first contact 134 from the second gate 122-2, thereby preventing shorting between the first and second gates 122-1 and 122-2. As can be seen the first gate contact 134 extends past the second gate 122-2 through a bottom of the liner 136 to contact the first gate 122-1. The insulating liner layer 136 can comprise a dielectric material, including, but not necessarily limited to, an oxide or a nitride. FIG. 7 is a schematic three-dimensional view illustrating a structure of a vertical tunnel FET and the contacts 128, 130, 132 and 134, according to an embodiment of the invention.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of manufacturing a vertical transistor device, comprising:
    forming a bottom source region on a semiconductor substrate;
    forming a channel region extending vertically from the bottom source region;
    forming a top drain region on an upper portion of the channel region; and
    forming a twin gate structure around the channel region, wherein the twin gate structure comprises a plurality of gates, wherein the plurality of gates consists of only two gates around the channel region, the two gates being spaced apart from each other and comprising:
        a first gate having a first gate length; and
        a second gate over the first gate;
    wherein the second gate has a second gate length different from the first gate length;
    wherein at least one dielectric layer is positioned between the first gate and the second gate;
    wherein the vertical transistor device comprises a single tunnel field-effect transistor (FET) comprising only one twin gate structure comprising the first gate and the second gate;
    wherein the first gate controls a read mechanism based on band-to-band tunneling, and the second gate creates a well for charge storage; and
    wherein the bottom source region and the top drain region have opposite doping types from each other.

2. The method according to claim 1, wherein the at least one dielectric layer is positioned on the first gate and under the second gate.

3. The method according to claim 1, wherein forming the first gate and the second gate comprises:
    forming a first dummy gate layer around the channel region;
    forming a second dummy gate layer over the first dummy gate layer and around the channel region; and
    removing the first and second dummy gate layers;
    wherein the first gate and the second gate are formed in spaces left by the removal of the first and second dummy gate layers, respectively.

4. The method according to claim 3, wherein the first and second dummy gate layers are selectively removed with respect to the at least one dielectric layer.

5. The method according to claim 3, wherein the first and second dummy gate layers have different vertical thicknesses from each other.

6. The method according to claim 1, further comprising forming spacer layers on respective upper and lower sides of each of the first gate and the second gate.

7. The method according to claim 1, further comprising forming a spacer layer on an upper side of the bottom source region between the first gate and the bottom source region.

8. The method according to claim 1, further comprising forming a spacer layer on an upper side of the second gate between the second gate and the top drain region.

9. The method according to claim 1, further comprising forming a liner layer on top and lateral sides of the channel region.

10. The method according to claim 9, wherein the liner layer extends onto the bottom source region.

11. The method according to claim 9, wherein the liner layer comprises an oxide.

12. The method according to claim 1, further comprising:
    forming a first contact contacting the first gate; and
    forming a second contact contacting the second gate.

13. The method according to claim 12, further comprising forming a dielectric liner layer adjacent the first contact, wherein the dielectric liner layer electrically isolates the first contact from the second gate.

14. The method according to claim 1, wherein the channel region is undoped.

15. The method according to claim 1, wherein the bottom source region and the top drain region are respective source and drain regions for the single tunnel FET comprising the twin gate structure.

16. A method of manufacturing a vertical tunnel field-effect transistor (FET), comprising:
    forming a bottom source region on a semiconductor substrate;
    forming a channel region extending vertically from the bottom source region;
    forming a top drain region on an upper portion of the channel region;
    forming a twin gate structure around the channel region, wherein the twin gate structure comprises a plurality of gates, wherein the plurality of gates consists of only two gates around the channel region, the two gates being spaced apart from each other and comprising:
    a first gate having a first gate length on the bottom source region; and
    a second gate having a second gate length different from the first gate length; and
    forming at least one dielectric layer on the first gate;
    wherein the second gate is formed on the at least one dielectric layer;
    wherein the bottom source region is oppositely doped from the top drain region;
    wherein the vertical tunnel FET is a single tunnel FET comprising only one twin gate structure comprising the first gate and the second gate; and
    wherein the first gate controls a read mechanism based on band-to-band tunneling, and the second gate creates a well for charge storage.

17. The method according to claim 16, wherein the channel region is undoped.

18. The method according to claim 16, wherein the bottom source region and the top drain region are respective source and drain regions for the single tunnel FET comprising the twin gate structure.

\* \* \* \* \*